(12) United States Patent
Rocca

(10) Patent No.: US 10,165,342 B2
(45) Date of Patent: Dec. 25, 2018

(54) MICROPHONE ASSEMBLY AND METHOD OF MANUFACTURING A MICROPHONE ASSEMBLY

(71) Applicant: EPCOS AG, Munich (DE)

(72) Inventor: Gino Rocca, Copenhagen (DK)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 15/306,928

(22) PCT Filed: May 12, 2014

(86) PCT No.: PCT/EP2014/059648
§ 371 (c)(1),
(2) Date: Oct. 26, 2016

(87) PCT Pub. No.: WO2015/172809
PCT Pub. Date: Nov. 19, 2015

(65) Prior Publication Data
US 2017/0055056 A1     Feb. 23, 2017

(51) Int. Cl.
*H04R 1/04*          (2006.01)
*H03F 3/45*          (2006.01)
*H04R 19/04*         (2006.01)
*H03F 3/183*         (2006.01)
(Continued)

(52) U.S. Cl.
CPC ............ *H04R 1/04* (2013.01); *H03F 3/183* (2013.01); *H03F 3/45071* (2013.01); *H03G 3/3005* (2013.01); *H04R 19/005* (2013.01); *H04R 19/04* (2013.01); *H03F 2200/03* (2013.01); *H03F 2200/267* (2013.01); *H04R 2201/003* (2013.01)

(58) Field of Classification Search
None
See application file for complete search history.

(56) References Cited

U.S. PATENT DOCUMENTS

| 2004/0202345 | A1* | 10/2004 | Stenberg | H04R 19/04 381/369 |
| 2008/0253057 | A1* | 10/2008 | Rijks | H01G 5/16 361/281 |
| 2008/0310655 | A1 | 12/2008 | Holzmann | |

(Continued)

FOREIGN PATENT DOCUMENTS

| DE | 112011105008 T5 | 11/2013 |
| DE | 112012006343 T5 | 1/2015 |

(Continued)

OTHER PUBLICATIONS

Martin, David Thomas "Design, Fabrication, and Characterization of a MEMS Dual-Backplate Capacitive Microphone." pp. 1-250. 2007.*

*Primary Examiner* — Thomas Maung
*Assistant Examiner* — Qin Zhu
(74) *Attorney, Agent, or Firm* — Slater Matsil, LLP

(57) ABSTRACT

A microphone assembly and a method for manufacturing a microphone assembly are disclosed. In an embodiment, the microphone assembly includes a MEMS dual backplate microphone configured to provide a differential output signal, an ASIC including a differential amplifier configured to receive the differential output signal and a control element configured to adjust at least one of a setting of the MEMS dual backplate microphone and a setting of the ASIC.

14 Claims, 1 Drawing Sheet

(51) Int. Cl.
*H03G 3/30* (2006.01)
*H04R 19/00* (2006.01)

(56) References Cited

U.S. PATENT DOCUMENTS

| | | | | |
|---|---|---|---|---|
| 2011/0164760 A1* | 7/2011 | Horibe | ............... | G01S 3/8006 381/92 |
| 2013/0028450 A1* | 1/2013 | Cortese | ............... | B81B 7/0064 381/174 |
| 2013/0044899 A1* | 2/2013 | Barber | ............... | H04R 19/016 381/113 |
| 2013/0051582 A1* | 2/2013 | Kropfitsch | ............... | H03F 1/56 381/111 |
| 2013/0136267 A1* | 5/2013 | Hammerschmidt | ...... | H04R 3/06 381/58 |
| 2014/0037121 A1 | 2/2014 | Mortensen | | |
| 2014/0086433 A1* | 3/2014 | Josefsson | ............... | H04R 3/06 381/98 |
| 2014/0266260 A1* | 9/2014 | Wurzinger | ......... | G01R 27/2605 324/684 |
| 2014/0270250 A1* | 9/2014 | Muza | ................ | H04R 1/406 381/94.1 |
| 2015/0023529 A1* | 1/2015 | Barzen | ............... | G01R 27/2605 381/174 |
| 2015/0129992 A1* | 5/2015 | Hur | ................ | H04R 19/04 257/416 |
| 2015/0131812 A1 | 5/2015 | Schober et al. | | |
| 2016/0080879 A1* | 3/2016 | Wiesbauer | ........... | H04R 29/004 381/58 |

FOREIGN PATENT DOCUMENTS

| | | |
|---|---|---|
| JP | 2012090224 A | 5/2012 |
| JP | 2014510472 A | 4/2014 |
| JP | 2015523764 A | 8/2015 |
| WO | 2012119637 A1 | 9/2012 |
| WO | 2013083203 A1 | 6/2013 |
| WO | 2013102499 A1 | 7/2013 |
| WO | 2013167183 A1 | 11/2013 |

* cited by examiner

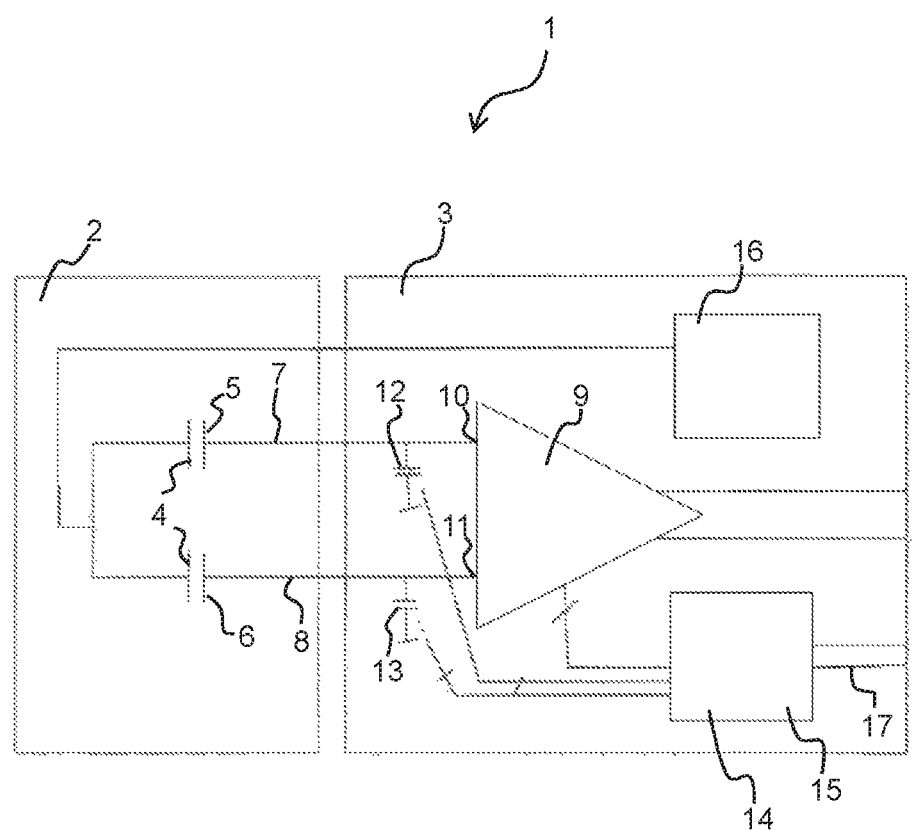

MICROPHONE ASSEMBLY AND METHOD OF MANUFACTURING A MICROPHONE ASSEMBLY

This patent application is a national phase filing under section 371 of PCT/EP2014/059648, filed May 12, 2014, which is incorporated herein by reference in its entirety.

TECHNICAL FIELD

The present invention concerns a microphone assembly and a method of manufacturing a microphone assembly.

BACKGROUND

The microphone assembly comprises a MEMS (microelectromechanical system) dual backplate microphone. The MEMS dual backplate microphone is configured to provide a differential signal. Differential signaling is a method of transmitting information electrically with two complementary signals sent on two paired paths. Since external interference tend to affect both paths together, and information is sent only by the difference between the signals, the technique improves resistance to electromagnetic noise compared with use of only one signal.

The common mode rejection ratio (CMRR) of a differential microphone assembly is the ratio of the rejection of unwanted input signals common to both signal paths, relative to the wanted differential signal. To increase the CMRR in a differential microphone assembly, the differential gain between the signals has to be maximized and the common mode gain has to be minimized.

SUMMARY OF THE INVENTION

Embodiments of the invention include a microphone assembly wherein the quality of an output signal is improved. Moreover, other embodiments of the invention provide a method of manufacturing such a microphone assembly.

A microphone assembly is provided which comprises a MEMS dual backplate microphone configured to provide a differential output signal, an ASIC (application-specific integrated circuit) comprising a differential amplifier configured to receive the differential output signal, and a control element configured to adjust a setting of the MEMS dual backplate microphone and/or of the ASIC.

The proposed microphone assembly allows for a correction of manufacturing tolerances. The control element can adjust the setting of the MEMS dual backplate microphone and/or of the ASIC such that any tolerances can be equalized for.

In this context the term "setting of the MEMS dual backplate microphone and/or of the ASIC" shall refer to the setting of at least one parameter of the MEMS dual backplate microphone and/or of an element of the ASIC. Examples of such a parameter are a voltage applied to a membrane or to one of the backplates, a capacitance of a capacitor of the ASIC or a gain setting of the differential amplifier.

By setting one of these parameters, the control element can influence the behaviour of the microphone assembly. Thus, the control element can adjust the setting of the MEMS dual backplate microphone and/or of the ASIC such that the properties of the microphone assembly are improved. In particular, the control element can adjust the settings such that the quality of an output signal is optimized. The output signal may be a balanced signal. In this case, the quality of the output signal can be optimized e.g. regarding the balancing of the output signal.

Overall, due to process variations in the manufacturing of the MEMS dual backplate microphone and the ASIC, the MEMS dual backplate microphone and the ASIC cannot be manufactured perfectly symmetric. The MEMS dual backplate microphone is configured to provide a differential output signal which consists of two complementary output signals. However, due to the above mentioned process variations, the two signals may not be perfectly complementary and, further, the two signals may be processed differently, resulting in a deteriorated output signal of the microphone assembly.

The control element being enabled to adjust a setting of the MEMS dual backplate microphone and/or a setting of the ASIC allows to correct for the asymmetries in the MEMS dual backplate microphone and in the ASIC, thereby improving the quality of the output signal of the microphone assembly.

As the control element is formed on the ASIC, no external components are required to carry out the desired adjustments. Thus, the microphone assembly has reduced space requirements.

The differential amplifier may be a preamplifier. A preamplifier is an electronic amplifier that prepares a small electrical signal, e.g. from a sensor, for further amplification or processing. It is used to boost the signal strength without significantly degrading the signal-to-noise ratio (SNR).

A differential amplifier is configured to amplify the difference between its input signals. The control member may be configured to adjust the setting such that the balancing of the input signals of the differential amplifier is optimized. In this case, the CMRR of the microphone assembly is improved. In particular, in this case it is ensured that any noise will effect both input signals equally such that the differential amplifier can equalize for the noise as the noise does not influence the difference between the two input signals.

In one embodiment, the differential amplifier is configured to provide a balanced output signal. Further, the control element may be configured to adjust the setting such that a balancing of the balanced output signal is optimized.

In particular, the balanced output signal may consist of two complementary signals. Further, the control element may be configured to adjust the setting such that clipping is reached simultaneously for the two complementary signals of the balanced output signal.

Clipping is a form of distortion that limits a signal once it exceeds a threshold. Clipping may occur when a signal is recorded by the MEMS dual backplate microphone that has constraints on the range of the differential amplifier.

In this embodiment, the dynamic range of the microphone assembly is improved as the dynamic range is limited by clipping. Here, clipping of the differential amplifier arranged in the ASIC is reached simultaneously by both its output signals, such that one signal reaching clipping before the respective other one does not limit the dynamic range.

In one embodiment, the MEMS dual backplate microphone comprises a membrane arranged between a first backplate and a second backplate. The control element may be configured to adjust a voltage applied to the membrane and/or the control element may be configured to adjust a voltage applied to the first backplate and a voltage applied to the second backplate.

This embodiment allows for the setting of different capacitances between the membrane and the first backplate and the membrane and the second backplate. Thereby, asymmetries in the manufacturing of the MEMS dual backplate microphone can be adjusted.

In one embodiment, the ASIC may comprise a first damping capacitor and a second damping capacitor wherein the control element is configured to adjust a capacitance of the first damping capacitor and/or a capacitance of the second damping capacitor. The damping capacitors may be used as signal dividers. In particular, by adjusting the capacitance of the respective damping capacitor, the signal strength of an input signal of the differential amplifier can be adjusted.

The control element may be configured to adjust each of the capacitance of the first damping capacitor and the capacitance of the second damping capacitor individually from the respective other capacitance.

A first signal path may connect a first input of the differential amplifier to the MEMS dual backplate microphone and a second signal path may connect a second input of the differential amplifier to the MEMS dual backplate microphone. The first damping capacitor may be connected to the first signal path and to a reference potential. The second damping capacitor may be connected to the second signal path and to the reference potential. The reference potential may be ground.

Further, the control element may be configured to adjust a gain setting of the differential amplifier. In particular, the differential amplifier may have two internal channels wherein one internal channel corresponding to the two complementary signals of the differential signal. In particular, the gain setting of each of the internal channels of the differential amplifier may be adjusted independently from the respective other internal channel.

This allows for correcting unbalances in the microphone assembly. The differential amplifier may comprise transistors wherein gain settings of the differential amplifier may be adjusted by amending the size of the transistors.

In one embodiment, the assembly may comprise a memory element wherein the memory element is configured to store information concerning the setting. Further, the control element may be configured to adjust the setting according to the information stored in the memory element.

In particular, the control element and the memory element may be formed by a single device.

The memory element may be a non-volatile memory. Accordingly, the memory element is configured to store the information even if the microphone assembly is powered off. Thus, it is ensured that the stored information does not get lost during power off.

The memory element may be a one-time programming device. Accordingly, the memory element may be configured such that after it has been programmed once, the stored information cannot be overwritten anymore. The memory element may be programmed during a final testing stage of the manufacturing process of the microphone assembly. Accordingly, the optimized setting is stored in the memory element at the end of the manufacturing process. If the memory element is a one-time programming device, it is ensured that this optimal setting cannot accidently be overwritten later.

However, in an alternative embodiment, the memory element may be configured to be a multiple time programming device. In this case, during operation of the microphone assembly, it may be possible to reconfigure the assembly such that a new optimal setting is determined and stored in the memory element. Thereby, aging effects of the microphone assembly may be adjusted for.

A second aspect of the present invention concerns a method of manufacturing a microphone assembly.

The assembly comprises a MEMS dual backplate microphone configured to provide a differential output signal, an ASIC comprising a differential amplifier configured to receive the differential output signal, a control element configured to adjust a setting of the MEMS dual backplate microphone and/or the ASIC and a memory element. The method may comprise the steps of testing the assembly, determining an optimal setting of the MEMS dual backplate microphone and/or the ASIC and storing the optimal setting in the memory element.

The microphone assembly manufactured by this method may be the microphone assembly described above. Thus, any structural and functional feature disclosed with respect to the microphone assembly may also be present with respect to the method. Vice versa, any structural and functional feature disclosed with respect to the method may also be present with respect to the microphone assembly.

The method provides the advantages that the manufactured microphone assembly has an optimized setting of the MEMS dual backplate microphone and the ASIC. In particular, unavoidable process variations can be equalized by adjusting the setting correspondingly. The setting may be optimized, for example, such that the balancing of a balanced output signal is improved. The method does not require external components for improving the balancing. Moreover, the method allows for improving the dynamic range of the microphone assembly.

In one embodiment, the MEMS dual backplate microphone comprises a membrane arranged between a first backplate and a second backplate. The step of determining the optimal setting comprises the step of determining a setting of a voltage applied to the membrane and/or the step of determining the optimal setting comprises the step of determining a setting of a voltage applied to the first backplate and a voltage applied to the second backplate.

In one embodiment, the ASIC may comprise a first damping capacitor and a second damping capacitor wherein the step of determining the optimal setting comprises the step of determining a setting of a capacitance of the first damping capacitor and/or a capacitance of the second damping capacitor.

In one embodiment, the step of determining the optimal setting may comprise the step of determining a gain setting of the differential amplifier.

The differential amplifier may be configured to provide a balanced output signal. The optimal setting may be defined as the setting wherein a balancing of the balanced output signal is optimized.

In particular, the differential amplifier may be configured to provide a balanced output signal consisting of two complementary signals. The optimal setting may be defined as the setting wherein clipping is reached simultaneously for the two complementary signals of the balanced output signal.

BRIEF DESCRIPTION OF THE DRAWINGS

In the following, the disclosed microphone assembly and the method are described in further detail with reference to the drawing, wherein FIGURE shows a microphone assembly.

The FIGURE shows a microphone assembly 1. The microphone assembly 1 comprises a MEMS dual backplate microphone 2 and an ASIC 3.

DETAILED DESCRIPTION OF ILLUSTRATIVE EMBODIMENTS

The MEMS dual backplate microphone 2 comprises a movable membrane 4 arranged between a first backplate 5 and a second backplate 6. A bias voltage is applied between the membrane 4 and the first backplate 5 and, respectively, the membrane 4 and the second backplate 6. For this purpose a voltage is applied to the membrane 4. Alternatively or additionally, a first voltage can be applied to the first backplate 5 and a second voltage can be applied to the second backplate 6.

The MEMS dual backplate microphone 2 is configured to provide a differential output signal. Differential signaling is a method of transmitting information electrically with two complementary signals sent on two paired paths.

The first backplate 5 is connected to a first signal path 7. The second backplate 6 is connected to a second signal path 8. The MEMS dual backplate microphone 2 is configured to provide a signal in the first signal path 7 and a signal in the second signal path 8, wherein the signal in the first signal path 7 and the signal in the second signal path 8 are complementary. Accordingly, they form a differential signal.

In particular, when the membrane 4 moves towards one of the backplates 5, 6, the capacitance between the membrane 4 and the backplate 5, 6 is increased and thereby the voltage of the signal is increased. At the same time, the membrane 4 moves away from the other backplate 5, 6 such that the corresponding capacitance between the membrane 4 and the other backplate 5, 6 is reduced and the voltage of the corresponding signal is also reduced.

The ASIC 3 comprises a differential amplifier 9. The differential amplifier 9 comprises a first input 10 and a second input 11. Each of the inputs 10, 11 is configured to receive an input signal. The differential amplifier 9 is configured to amplify the difference between its input signals.

The ASIC 3 is configured to receive the differential signal as an input signal. In particular, the first signal path 7 continues into the ASIC 3. The second signal path 8 also continues into the ASIC 3. The first signal path 7 connects the first backplate 5 of the MEMS dual backplate microphone 2 with a first input 10 of the differential amplifier 9. The second signal path 8 connects the second backplate 6 of the MEMS dual backplate microphone 2 with a second input 11 of the differential amplifier 9.

The differential amplifier 9 is further configured to provide a balanced output signal. The differential amplifier 9 has a first internal channel (not shown) and a second internal channel (not shown). The first internal channel is configured to process the input signal received at the first input 10. The second internal channel is configured to process the input signal received at the second input 11.

The differential amplifier 9 is configured such that a gain setting for the first internal channel and a gain setting for the second channel can be adjusted independently from each other.

Further, the ASIC 3 comprises a first damping capacitor 12 and a second damping capacitor 13. The capacitance of the first damping capacitor 12 is adjustable. The capacitance of the second damping capacitor 13 is also adjustable. The first damping capacitor 12 is connected to the first signal path 7 and to a reference potential. The second damping capacitor 13 is connected to the second signal path 8 and to the reference potential. The reference potential corresponds to ground.

When the variable capacitance of the first damping capacitor 12 is adapted, the strength of a signal travelling through the first signal path 7 to the first input 10 of the differential amplifier 9 is adjusted. Correspondingly, when the variable capacitance of the second damping capacitor 13 is adapted, the strength of a signal travelling through the second signal path 8 to the second input 11 of the differential amplifier 9 is adjusted. Each of the first and the second damping capacitor 12, 13 can be used as a signal divider to adjust the signal strength at the corresponding input 10, ii of the differential amplifier 9.

Further, the ASIC 3 comprises a control element 14. The ASIC 3 also comprises a memory element 15. In the embodiment shown in FIG. 1, the control element 14 and the memory element 15 are formed by a single unit.

In the memory element 15 a setting of the MEMS dual backplate microphone 2 and/or the ASIC 3 is stored. The control element 14 is configured to set the MEMS dual backplate microphone 2 and/or the ASIC 3 according to information stored in the memory element 15. The control element 14 is programmed to read out the information stored in the memory element 15 and to adjust the setting of the MEMS dual backplate microphone 2 and/or the ASIC 3 according to this information.

In particular, the control element 14 is configured to set the capacitance of the first damping capacitor 12 and the capacitance of the second damping capacitor 13.

Moreover, the control element 14 is configured to set a gain setting of the differential amplifier 9. In particular, the gain setting of each of the internal channels of the differential amplifier 9 can be set individually from the gain setting of the respective other internal channel of the differential amplifier 9.

In the embodiment shown in the FIGURE, the ASIC 3 further comprises a charge pump 16 connected to the membrane 4 of the MEMS dual backplate microphone 2. The charge pump 16 is configured to provide a bias voltage to the membrane 4. The control element 14 can further be configured to adjust the bias voltage applied by the charge pump 16 to the membrane 4.

Additionally or alternatively, voltages can also be applied to the first backplate 5 and to the second backplate 6. The control element 14 can further be configured to adjust a voltage applied to the first backplate 5. Furthermore, the control element 14 can be configured to adjust a voltage applied to the second backplate 6.

The control element 14 is configured to set at least one of the capacitance of the first damping capacitor 12, the capacitance of the second damping capacitor 13, the gain setting of the first internal channel, the gain setting of the second internal channel, the voltage applied to the membrane 4, the voltage applied to the first backplate 5 and the voltage applied to the second backplate 6. In the memory element 15, information regarding at least one of said parameters is stored. The control element 14 can be configured to set the parameter according to corresponding information stored in the memory element 15.

In an ideal circuit the capacitor formed between the membrane 4 and the first backplate 5 and the capacitor formed between the membrane 4 and the second backplate 6 are perfectly symmetric. Further, in an ideal circuit, the first signal path 7 is perfectly symmetric to the second signal path 8. Moreover, in an ideal circuit, the differential amplifier 9 provides a perfectly balanced output signal.

However, in the real microphone assembly 1, asymmetries in the MEMS dual backplate microphone 2, the signal paths 7, 8 and the differential amplifier 9 are unavoidable, thus resulting in a not perfectly balanced output signal of the differential amplifier 9. These asymmetries may arise, e.g. due to the manufacturing process of the MEMS dual backplate microphone 2 and/or of the ASIC 3.

To improve the balancing of the output signal, the setting of the MEMS dual backplate microphone 2 and/or the ASIC 3 can be adjusted. In particular, certain parameters of the ASIC 3 can be set such that the two complementary signals provided by the MEMS dual backplate microphone 2 are processed differently. Further, certain parameters of the MEMS dual backplate microphone 2 can be adjusted to trim the signals provided by the MEMS dual backplate microphone 2. Thereby, any asymmetries in the microphone assembly 1 can be adjusted for.

In particular, the control element 14 can be configured to set some of the above-discussed parameters such that the balancing of the balanced output signal of the differential amplifier 9 is optimized. The balanced output signal consists of two complementary signals. The control element 14 can be configured to set some of the parameters such that clipping is reached at the same signal strength for both of the complementary signals.

In the following, a method of manufacturing the microphone assembly 1 shown in the FIGURE is discussed.

First, the microphone assembly 1 is assembled as shown in the FIGURE. In a last step of the manufacturing process, a final test of the microphone assembly 1 is carried out. During the final test, measurements are taken at different points of the microphone assembly 1.

In particular, a predefined acoustic signal with a known signal strength is provided to the MEMS dual backplate microphone 2. Then, the signal strength of signal entering the first signal path 7 at the first backplate 5 and signals entering the second signal path 8 at the second backplate 6 are measured. Further, the signal strength of the signals at the end of the first and the second signal path 7, 8 are measured. The balanced output signal of the differential amplifier 9 is also measured.

From these data, the balancing of the microphone assembly 1 is estimated. The measurement may be repeated several times with varying predefined acoustic input signals.

Afterwards, an optimized setting of the MEMS dual backplate microphone 2 and/or the ASIC 3 is calculated such that the balancing of the balanced output signal is optimized. In particular, the capacitance of the first and the second damping capacitor 12, 13, the voltages applied to the membrane 4 and/or the first and the second backplate 5, 6 can be adjusted. The gain setting of the differential amplifier 9 can also be adjusted.

When the optimal setting is determined in this final testing step, the information regarding the setting is stored in the memory element 15. The method further comprises the step of programming the control element 14 to read out the information stored in the memory element 15 and to set the MEMS dual backplate microphone 2 and/or the ASIC 3 correspondingly. Every time the microphone assembly 1 is powered on from now on, the control element 14 reads out the stored information from the memory element 15 and sets the corresponding parameters accordingly.

Furthermore, the memory element 15 comprises a pin 17 for applying a high voltage. The pin 17 is required to write information into the memory element 15.

I claim:
1. A microphone assembly comprising:
   a MEMS dual backplate microphone configured to provide a differential output signal;
   an ASIC comprising a differential amplifier configured to receive the differential output signal;
   a memory element configured to store information concerning a setting of a parameter of the ASIC; and
   a control element configured to adjust the setting of the parameter of the ASIC,
   wherein the ASIC comprises a first damping capacitor and a second damping capacitor,
   wherein the control element is configured to adjust at least one of a capacitance of the first damping capacitor or a capacitance of the second damping capacitor,
   wherein a first signal path connects a first backplate of the MEMS dual backplate microphone with a first input of the differential amplifier and a second signal path connects a second backplate of the MEMS dual backplate microphone with a second input of the differential amplifier,
   wherein the first damping capacitor is connected to the first signal path and to a reference potential, and
   wherein the second damping capacitor is connected to the second signal path and to the reference potential.

2. The microphone assembly according to claim 1, wherein the differential amplifier is configured to provide a balanced output signal, and wherein the control element is configured to adjust the setting such that a balancing of the balanced output signal is optimized.

3. The microphone assembly according to claim 1, wherein the differential amplifier is configured to provide a balanced output signal consisting of two complementary signals, and wherein the control element is configured to adjust the setting such that clipping is reached simultaneously for the two complementary signals of the balanced output signal.

4. The microphone assembly according to claim 1, wherein the MEMS dual backplate microphone comprises a membrane arranged between a first backplate and a second backplate, wherein the control element is configured to adjust a voltage applied to the membrane, and/or wherein the control element is configured to adjust a voltage applied to the first backplate and a voltage applied to the second backplate.

5. The microphone assembly according to claim 1, wherein the control element is configured to adjust a gain setting of the differential amplifier.

6. The microphone assembly according to claim 1, wherein the memory element is a non-volatile memory.

7. The microphone assembly according to claim 1, wherein the memory element is a one time programming device.

8. A method for manufacturing a microphone assembly, wherein the microphone assembly comprises a MEMS dual backplate microphone configured to provide a differential output signal, an ASIC comprising a differential amplifier configured to receive the differential output signal, a memory element configured to store information concerning a setting of a parameter of the ASIC and a control element configured to adjust the setting of the parameter of the ASIC, wherein the ASIC comprises a first damping capacitor and a second damping capacitor, wherein the control element is configured to adjust at least one of a capacitance of the first damping capacitor or a capacitance of the second damping capacitor, wherein a first signal path connects a first backplate of the MEMS dual backplate microphone with a first input of the differential amplifier and a second signal path connects a second backplate of the MEMS dual backplate microphone with a second input of the differential amplifier, wherein the first damping capacitor is connected to the first signal path and to a reference potential, and wherein the second damping capacitor is connected to the second signal path and to the reference potential, the method comprising:

testing the microphone assembly;

determining the setting of the parameter of the ASIC; and storing the setting in the memory element.

9. The method according to claim 8, wherein the MEMS dual backplate microphone comprises a membrane arranged between a first backplate and a second backplate, wherein determining the setting comprises determining a setting of a voltage applied to the membrane, and/or wherein determining the setting comprises determining a setting of a voltage applied to the first backplate and a voltage applied to the second backplate.

10. The method according to claim 8, wherein determining the setting comprises determining a gain setting of the differential amplifier.

11. The method according to claim 8, wherein the differential amplifier is configured to provide a balanced output signal, and wherein the setting is defined as a setting wherein a balancing of the balanced output signal is optimized.

12. The method according to claim 8, wherein the differential amplifier is configured to provide a balanced output signal consisting of two complementary signals, and wherein the setting is defined as a setting wherein clipping is reached simultaneously for the two complementary signals of the balanced output signal.

13. The microphone assembly according to claim 1, wherein the control element is configured to adjust the setting of the ASIC according to the information stored in the memory element.

14. The method according to claim 8, wherein the control element is configured to adjust the setting of the ASIC according to the information stored in the memory element.

\* \* \* \* \*